United States Patent [19]

Rumreich et al.

[11] Patent Number: 5,030,922
[45] Date of Patent: Jul. 9, 1991

[54] SUPPLY CURRENT COMPENSATION CIRCUITRY

[75] Inventors: Mark F. Rumreich; David L. Albean, both of Indianapolis, Ind.

[73] Assignee: Thomson Consumer Electronics, Inc., Indianapolis, Ind.

[21] Appl. No.: 503,579

[22] Filed: Apr. 3, 1990

[51] Int. Cl.$^5$ .............................................. H03F 3/45
[52] U.S. Cl. ................................... 330/253; 330/261; 330/297
[58] Field of Search ...................... 330/253, 261, 297

[56] References Cited

U.S. PATENT DOCUMENTS

| | | | |
|---|---|---|---|
| 3,868,537 | 2/1975 | Haferl | 315/389 |
| 3,868,582 | 2/1975 | Haferl | 330/22 |
| 3,904,973 | 9/1975 | Haferl | 330/22 |
| 4,217,555 | 8/1980 | Iwamatsu | 330/297 X |
| 4,327,332 | 4/1982 | Malchow | 330/261 |

OTHER PUBLICATIONS

National Semiconductor Data Sheet LM136/LM236/LM336, 2.5V Reference Diode, 1978

National Semiconductor Linear Databook, pp. 2-16 to 2-21.

Primary Examiner—James B. Mullins
Attorney, Agent, or Firm—Joseph S. Tripoli; Eric P. Herrmann; James B. Hayes

[57] ABSTRACT

In apparatus including a number of functional elements coupled to a common supply bus, certain of the elements may draw time varying supply current related to signal being processed. Supply current compensation circuitry responsive to signal processed by such elements is included to draw equal and opposite time varying supply current to maintain the total supply current constant and thereby to limit localized supply potentials variation. Exemplary compensation circuitry for an amplifier includes a transistor coupled between the supply busses and controlled by signal potential from the amplifier to draw supply current proportional to the signal applied to the amplifier, which supply current is opposite in phase to supply current drawn by the amplifier.

6 Claims, 3 Drawing Sheets

SUPPLY CURRENT COMPENSATION CIRCUITRY

This invention relates to apparatus for compensating variations in supply current drawn from supply busses, which variations tend to affect the operation of circuits commonly connected to the supply busses.

BACKGROUND OF THE INVENTION

State of the art electronic systems typically include a plurality of functional elements in very compact modular subsystems. In such subsystems the functional elements are connected to common supply busses. Because of the compactness of the subsystems the supply busses may have not insignificant impedances. Often the current drawn from the supply busses by the functional elements is signal dependent, that is the current drawn by particular elements is not constant. Variations in the current drawn by the functional elements, in conjunction with the impedance of the supply busses will cause local time varying supply potentials being applied to respective functional elements. Such supply potential variations may adversely affect the transfer functions of particular elements.

Local supply potential variations may be precluded by, for example, including bypass capacitors at each functional element, however this solution tends to undesirably complicate the placement of functional elements in a highly compact system and/or undesirably enlarge the subsystem. This is particularly true where the subsystem is contained in an integrated circuit.

A solution to supply potential variation in an integrated circuit environment is set forth in U.S. Pat. No. 4,327,332 wherein a plurality of amplifiers are coupled to common supply busses. To preclude localized supply potential variations undesirably affecting the response of the respective amplifiers, each of the amplifiers is coupled to the supply bus via respective voltage regulator circuitry. The respective voltage regulators however tend to substantially increase overall circuit complexity and to be sensitive to temperature changes, etc.

SUMMARY OF THE INVENTION

The present invention includes apparatus coupled between supply busses, from which a functional element draws supply current, and which is conditioned by signal processed by the functional element to draw current from the supply bus equal and opposite in polarity to variations in supply current drawn by the functional element.

DETAILED DESCRIPTION

Figure 1:
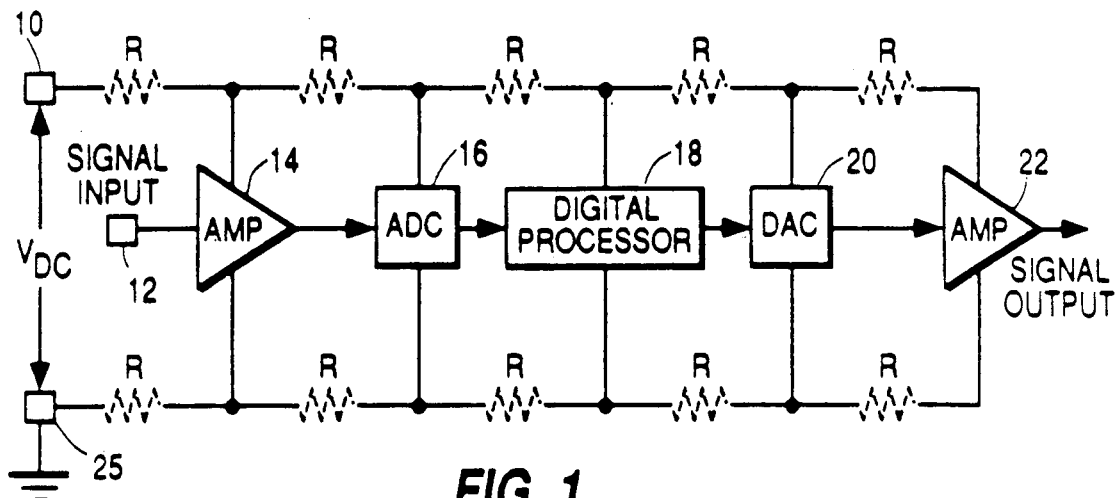
FIG. 1 is a block diagram of an electronic system illustrating an exemplary environment which exhibits the problem solved by the present invention.

FIG. 1 illustrates a system including an amplifier 14, an analog-to-digital converter (ADC) 14, a digital signal processor 18, a digital-to-analog converter (DAC) 20 and a further amplifier 22 coupled between common supply busses 10 and 25. The supply busses are drawn as cascade connected resistors R (drawn in phantom) to indicate that the supply busses include a not insignificant amount of resistance. Supply current drawn by the respective functional elements 14–22 will induce a potential drop along the busses. The busses are of sufficient size to insure that any D.C. potential drop along the busses is not so large as to preclude the functional element farthest from the application of the supply potential from operating.

Consider that amplifiers 14 and 22 draw supply currents functionally related to the instantaneous signals respectively applied to their input connections, and that elements 16, 18 and 20 draw substantially constant supply currents. The time varying supply currents drawn by the amplifiers will impose time varying potentials across the respective resistors, R, and consequently time varying supply potentials to the functional elements 16, 18 and 20. Where the functional elements are precision elements such as 8–10 bit ADC's or DAC's or are digital circuits designed to operate with fairly tight supply potential tolerances, the time varying supply potentials may severely affect the operation of such functional elements and in the worst case, may render them inoperable during certain time intervals.

Figure 2:
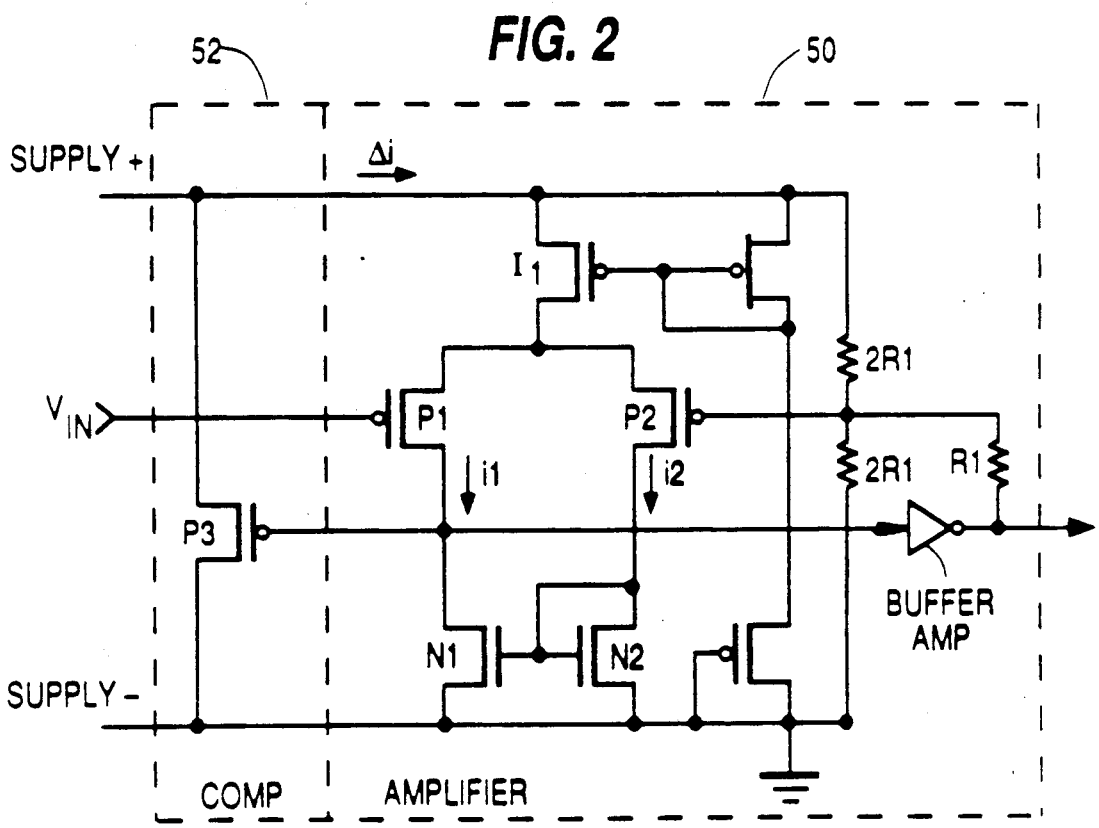
FIG. 2 is a schematic diagram illustrating an exemplary embodiment of the invention.
Figure 3A:
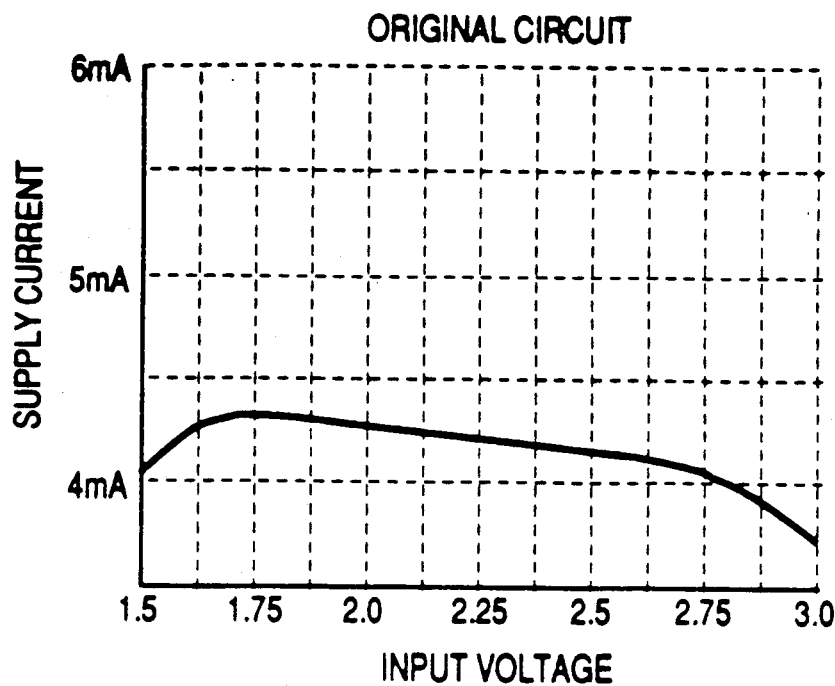
FIGS. 3A and 3B are graphical illustrations of the supply current drawn by the exemplary circuitry of FIG. 2 without, and with, implementation of the invention respectively.
Figure 3B:
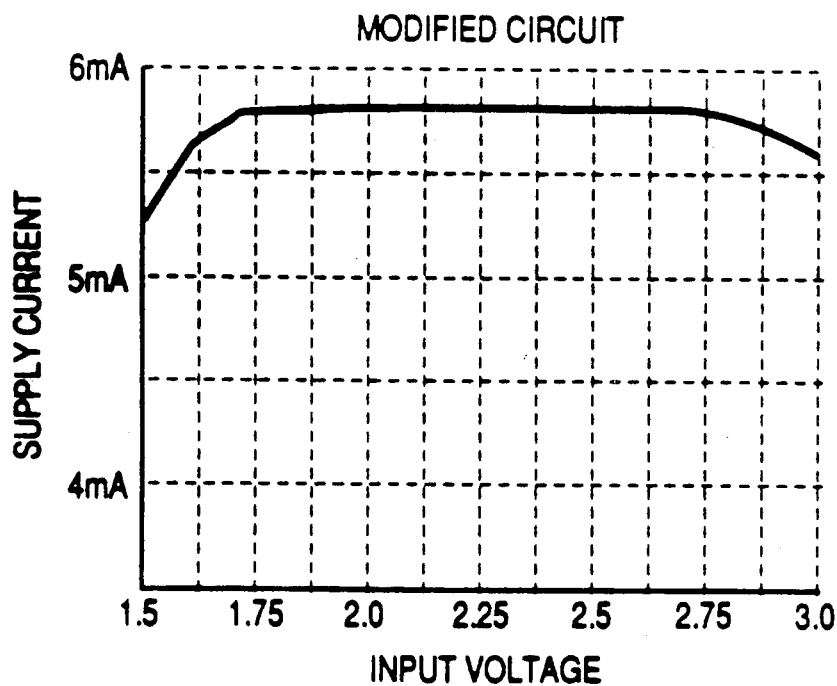

Refer next to FIG. 2 and FIGS. 3A and 3B. FIG. 2 shows a simple differential amplifier 50 with feedback and a supply current compensation circuit 52 coupled thereto. Amplifier 50 may be implemented as amplifiers 14 or 22 in the FIG. 1 circuitry.

The amplifier 50 is of conventional design and will not be described in detail. Suffice it to say that it includes a pair of p-type input transistors P1 and P2 having their source electrodes coupled to a constant current source I1 in a differential configuration. The drain electrodes of the transistors P1 and P2 are coupled respectively to the output and input terminals of a current mirror amplifier load circuit consisting of n-type transistors N1 and N2.

FIG. 3A is a graph of the supply current drawn by the amplifier 50 as a function of applied input signal voltage. FIG. 3B is a graph of the supply current drawn by the combination of the amplifier 50 and the current compensation circuit 52. FIG. 3A indicates that the supply current drawn by the amplifier 50 varies by approximately 3.4 percent over the linear operating range of input signal voltages. The expected variation in supply current may be determined by circuit simulation or by constructing test circuits and measuring the variation. From the plot of supply current versus signal input voltage, the requirements of supply current compensation circuitry may be determined. In this instance the supply current drawn by the amplifier varies linearly with changes in input signal voltage. Thus the supply current may be compensated with a linear current controlling device such as a transistor.

In FIG. 2 the supply current compensation circuitry consists of a p-type transistor P3 having drain and source electrodes respectively coupled to the relatively negative and relatively positive supply busses, and having its gate electrode coupled to a circuit node at which signal potential of appropriate polarity is available. A.C.

drain current, Δi, conducted by the transistor P3 is equal to Δv × gm where Δv is the value of the A.C. gate-to-source potential applied to the transistor and gm is the transconductance of the transistor. The value Δv is equal to $A_d \Delta v_{in}$ where $A_d$ is the voltage gain between the signal input electrodes of transistors P1 and N1 and $\Delta v_{in}$ represents A.C. input signal. The value of the transconductance of transistor P3, to compensate the supply current variations is given by $$gm = \Delta i/(A_d \Delta v_{in}) \qquad (1)$$

and $\Delta i/\Delta v_{in}$ is determined from the slope of the supply current versus input voltage characteristics of FIG. 3A. Transistor P3 is a p-type transistor, and as such conducts increasing drain current for decreasing gate voltage. The gate voltage decreases for increasing signal input voltage. Therefore, transistor P3 draws greater current from the supply busses as the signal input voltage increases, which is opposite to the supply current-signal voltage characteristic of the amplifier 50. The sum of the supply current drawn by the transistor P3 and the amplifier 50 is relatively constant for changes of signal voltage within the linear input dynamic range of the amplifier 50 as illustrated in FIG. 3B.

The total current conducted in transistor P3 is equal to the sum of a D.C. component $I_{DC}$ and the A.C. component Δi. In the exemplary embodiment of FIG. 2, it may be seen from FIGS. 3A AND 3B that the D.C. component is approximately 1.4 milliamperes or about 30 percent of the D.C. current drawn by the amplifier 50 without supply current compensation. This relatively high level of D.C. current conducted by transistor P3 undesirably increases the power dissipation of the circuitry by about 30 percent.

Figure 4:
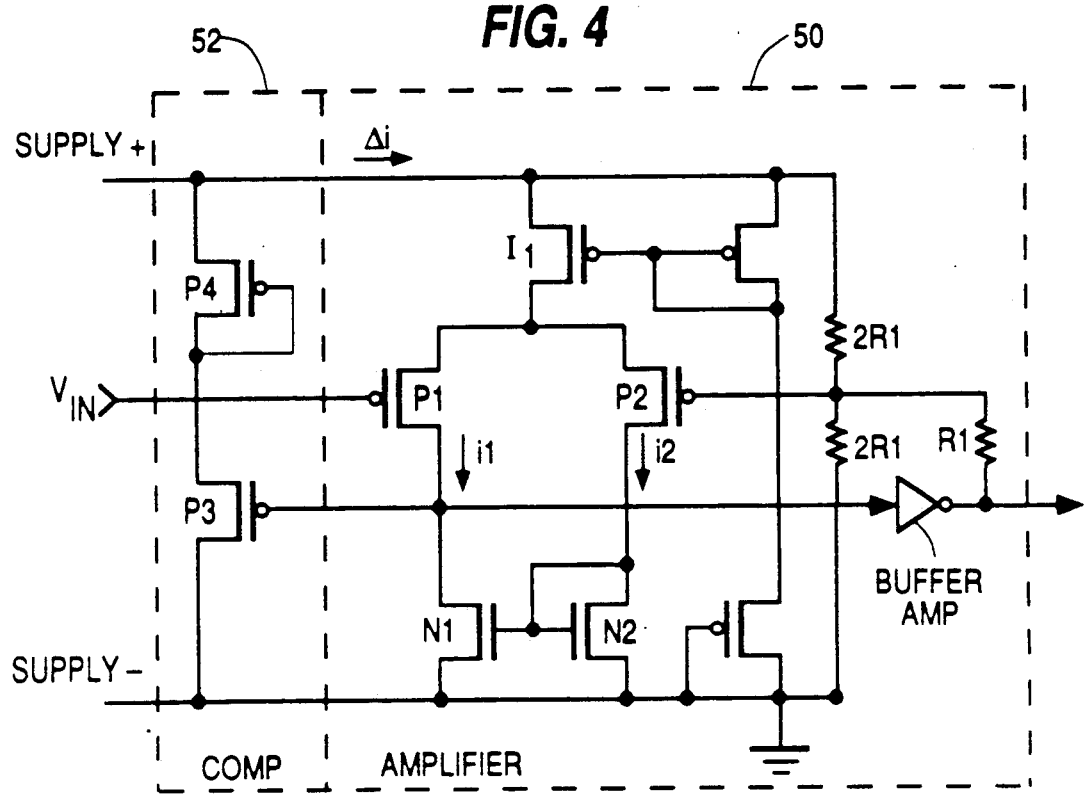
FIGS. 4 and 5 are schematic diagrams showing functional elements with alternative supply current compensation circuitry.

The D.C. current drawn by transistor P3 may be reduced by lowering the average gate-to-source potential applied to transistor P3. Assume that the relatively positive supply potential is $V_{DD}$ and the average potential applied to the gate electrode of transistor P3 is $V_g$ volts. The current $I_{DC}$ drawn by transistor P3 is given by the equation $$I_{DC} = K(V_g - V_{DD} - V_T)^2 \qquad (2)$$

where $V_T$ is the threshold potential of the transistor and K is a constant which is proportional to the transistor geometry. The D.C. current may be reduced by lessening the gate-source potential $V_g - V_{DD}$ by for example including intervening voltage drops between the supply bus and the source electrode of transistor P3. This is shown in FIG. 4 wherein a transistor P4, interconnected as a diode, is coupled between transistor P3 and the positive supply bus. As such transistor P4 reduces the gate-source potential by one $V_T$ potential thereby lessening the D.C. current conducted in transistor P3. Reducing the gate source potential of transistor P3 also reduces its transconductance. However, the geometry of the transistor P3 may be altered to compensate for the reduction in transconductance due to the reduction in gate-source voltage. Since the transconductance changes linearly with gate-source potential and the D.C. current changes proportional to the square of the gate-source potential, a net decrease in D.C. current can be attained while maintaining the transconductance at the appropriate value to provide the A.C. component of the compensating supply current.

Figure 5:
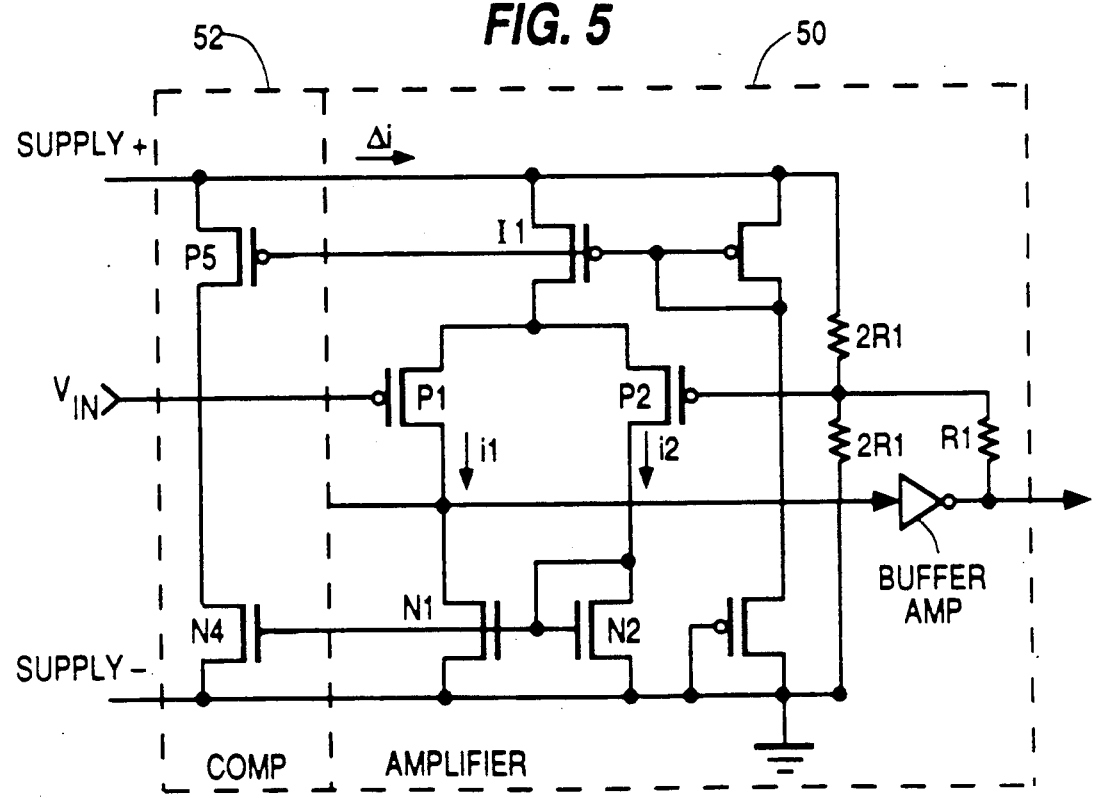

FIG. 5 illustrates a further embodiment in which the supply current compensation circuitry may be arranged to draw substantially no D.C. current from the supply bus and thus dissipate no excess power.

In FIG. 5, a p-type transistor P5 has its drain-source conduction path coupled in series with the drain-source conduction path of an n-type transistor N4, between the supply busses. A substantially constant bias potential is applied to the gate electrode of the transistor P5. The channel size of transistor P5 is selected, so that for the gate-source potential applied to transistor P5, it will conduct a current equal to the maximum variation in supply current drawn by the amplifier 50.

The gate electrode of transistor N4 is coupled to the gate electrode of the amplifier load transistor N2 and the source electrodes of transistors N2 and N4 are coupled to the relatively negative supply bus. Transistors N2 and N4 thus have like gate-source potentials. Transistors N2 and N4 will conduct currents in a ratio which is equal to the ratio of the channel areas of the transistors. Transistor N2 has its gate and drain electrodes interconnected to the drain electrode of transistor P2. The current $i_2$ coupled from the drain of transistor P2 to the interconnection of the gate and drain electrodes of transistor N2 will generate a potential across the gate and source electrodes just sufficient to condition transistor N2 to conduct the current $i_2$ applied thereto. The current, $i_2$, provided by transistor P2 is linearly proportional to the signal input potential. Since the current conducted by transistor N4 is proportional to the current conducted by transistor N2, the current conducted by transistor N4 is proportional to $i_2$ which is proportional to the signal input potential $\Delta v_{in}$. The relative size of transistor N4 is determined from the relationship $$(\Delta i/\Delta v_{in})/(i_2/\Delta v_{in}) = \text{size N4/size N2} \qquad (3)$$

or $$\Delta i/i_2 = \text{size N4/size N2} \qquad (4)$$

The ratio of the sizes of transistor N4 to transistor N2 is equal to the ratio of the variation of supply current as a function of input signal potential to the variation in current $i_2$ as a function of input signal potential.

In the supply compensation circuitry 52" of FIG. 5, transistor P5 limits the maximum supply current conducted while transistor N2 controls the time varying amplitude of the supply current.

What is claimed is:

1. In combination:

first and second conductors forming a bus for providing relatively positive and relatively negative supply potentials;

a plurality of functional elements coupled to said bus, said functional elements for processing time varying signals and at least one of said functional elements drawing time varying supply current functionally related to the time varying signal applied thereto, said at least one of said functional elements including;

an amplifier including a differential amplifier having a differential pair of transistors with output electrodes respectively coupled to input and output connections of a current mirror amplifier, and wherein said time varying signal is applied to a control electrode of at least one of said differential pair of transistors, and an output signal is taken from at least one of the input and output connections of said current mirror amplifier;

means coupled to said bus and responsive to said at least one functional element for drawing a compensating supply current to maintain the total current drawn by said means and said at least one of said functional elements substantially constant, said means comprising a single transistor having a control electrode coupled to one of the input and output connections of said current mirror amplifier and having a principal conduction path coupled between said first and second conductors.

2. The combination set forth in claim 1 wherein said means further includes impedance means coupled in series with the principal conduction path of said single transistor between said first and second conductors.

3. The combination set forth in claim 1 wherein said current mirror amplifier is comprised of field effect transistors of a first conductivity type and said single transistor is a field effect transistor of an opposite conductivity type having a control electrode coupled to the output terminal of said current mirror amplifier.

4. The combination set forth in claim 3 wherein said at least one of said functional elements further includes an inverting buffer amplifier having an input terminal coupled to the output terminal of said current mirror amplifier.

5. The combination set forth in claim 1 wherein said current mirror amplifier is comprised of field effect transistors of a first conductivity type and said single transistor is a field effect transistor of the same conductivity type having a control electrode coupled to the input terminal of said current mirror amplifier.

6. In combination:
first and second conductors forming a bus for providing relatively positive and relatively negative supply potentials;
a plurality of functional elements coupled to said bus, said functional elements for processing time varying signals and at least one of said functional elements drawing time varying supply current functionally related to the time varying signal applied thereto, said at least one of said functional elements including;
an amplifier having an input responsive to said time varying signal, and an output providing a signal representative of said time varying signal; and
means coupled to said bus and responsive to said signal representative of said time varying signal, for drawing a compensating supply current to maintain the total current drawn by said means and said amplifier substantially constant, said means comprising a single transistor having a control electrode coupled to the output of said amplifier, and having a principal conduction path coupled between said first and second conductors.

* * * * *